United States Patent
Aratake et al.

(10) Patent No.: US 8,251,077 B2
(45) Date of Patent: Aug. 28, 2012

(54) LIQUID PROCESSING APPARATUS, LIQUID PROCESSING METHOD AND STORAGE MEDIUM

(75) Inventors: Hidemasa Aratake, Koshi (JP); Norihiro Itoh, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 684 days.

(21) Appl. No.: 12/477,770

(22) Filed: Jun. 3, 2009

(65) Prior Publication Data
US 2009/0293914 A1 Dec. 3, 2009

(30) Foreign Application Priority Data
Jun. 3, 2008 (JP) .................................. 2008-145570

(51) Int. Cl.
*B08B 3/02* (2006.01)
(52) U.S. Cl. ......... 134/148; 134/158; 134/183; 134/902
(58) Field of Classification Search .................. 134/148, 134/153, 183, 903, 902
See application file for complete search history.

(56) References Cited

U.S. PATENT DOCUMENTS

| | | | |
|---|---|---|---|
| 5,906,860 A * | 5/1999 | Motoda et al. ................. | 427/240 |
| 6,793,769 B2 * | 9/2004 | Kajino et al. ............. | 156/345.55 |
| 7,332,055 B2 * | 2/2008 | Orii et al. .................. | 156/345.17 |
| 7,596,886 B1 * | 10/2009 | Boyd et al. ...................... | 34/317 |

FOREIGN PATENT DOCUMENTS

| | | |
|---|---|---|
| JP | 2002-184660 A | 6/2002 |
| JP | 2002-329696 A | 11/2002 |
| JP | 2008-60203 A | 3/2008 |

OTHER PUBLICATIONS

An Office Action dated Nov. 24, 2011, issued from the Japanese Patent Office (JPO) of Japanese Patent Application No. 2008-145570 and a partial English translation thereof.

* cited by examiner

*Primary Examiner* — Frankie L Stinson
(74) *Attorney, Agent, or Firm* — Abelman, Frayne & Schwab

(57) ABSTRACT

A liquid processing apparatus and method capable of separately collecting first and second processing liquids from each other, and preventing a formation of a defect (such as watermarks and particles) on a target substrate are disclosed. In one embodiment, the liquid processing apparatus includes a substrate holding device, a processing liquid supply device to supply a first processing liquid and a second processing liquid, a rotating cup, an outer discharge portion and an inner discharge portion to respectively discharge the first processing liquid and the second processing liquid received from the first receiving surface of the rotating cup, and a discharge portion switch device to open/close the outer discharge portion. The lower end of the first receiving surface of the rotating cup extends to a lower position than the position of the substrate held by the substrate holding device. The first processing liquid is discharged toward the outer discharge portion when the discharge portion switch device moves up, and the second processing liquid is discharged toward the inner discharge portion 16 when the discharge portion switch device moves down.

4 Claims, 5 Drawing Sheets (a)

(b)

LIQUID PROCESSING APPARATUS, LIQUID PROCESSING METHOD AND STORAGE MEDIUM

This application is based on and claims priority from Japanese Patent Application No. 2008-145570, filed on Jun. 3, 2008 with the Japanese Patent Office, the disclosure of which is incorporated herein in its entirety by reference.

TECHNICAL FIELD

The present invention relates to a liquid processing apparatus and method for performing liquid processing on a substrate, such as a semiconductor wafer or a liquid crystal display(LCD) glass substrate, by using a processing liquid, and a computer readable storage medium on which is stored a computer program that causes a computer to execute the liquid processing method.

BACKGROUND

A typical process of manufacturing a semiconductor device or an LCD, processing liquid includes supplying a processing liquid to a substrate, such as a semiconductor wafer or a glass substrate for an LCD panel, and a liquid processing of a surface of the substrate, or a thin film formed on the surface ("a liquid processing method").

A liquid processing method for cleaning a wafer has been suggested to include, for example, discharging a mixed aqueous solution of ammonia and hydrogen peroxide (a first processing liquid) to a substrate, such as a wafer while rotating the wafer and discharging a hydrofluoric acid (a second processing liquid) to the wafer while rotating the wafer to clean the wafer. Examples of such method are disclosed in Japanese Patent Laid-open Publication Nos. 2002-329696 and 2008-60203.

Due to a cost and environmental reason, some processing liquids is reused. Thus, when processing liquid is performed with first and second processing liquids, a separate collection of the first and second processing liquids would be required without mixing the first and second processing liquids.

A liquid processing apparatus to perform the liquid processing method includes a cup provided at an outside the circumferential periphery of the wafer, to guide the processing liquid shaken off from the wafer toward the outside while the wafer rotates. However, the processing liquid splashing from the cup may be scattered as mist and may reach the surface of the wafer, thereby causing a defect such as watermarks or particles.

SUMMARY

According to one embodiment, a liquid processing apparatus is provided. The liquid processing apparatus includes a substrate holding device to rotatably hold a substrate in a horizontal state, a processing liquid supply device to selectively supply a first processing liquid and a second processing liquid on the substrate held by the substrate holding device, a rotating cup disposed at an outside a circumferential periphery of the substrate held by the substrate holding device, the rotating cup including a first receiving surface to receive the first processing liquid and the second processing liquid that has been used in liquid processing of the substrate, an outer discharge portion and an inner discharge portion provided under the rotating cup so as to respectively discharge the first processing liquid and the second processing liquid received from the first receiving surface of the rotating cup, and a discharge portion switch device configured to move upwardly/downwardly at an outside a circumferential periphery of the rotating cup so as to open/close the outer discharge portion. A lower end of the first receiving surface of the rotating cup extends to a lower position than a position of the substrate held by the substrate holding device. In response to an opening of the outer discharge portion, the first processing liquid received from the first receiving surface of the rotating cup is discharged from the lower end of the first receiving surface toward the outer discharge portion. In response to a closing of the outer discharge portion, the second processing liquid received from the first receiving surface of the rotating cup is discharged from the lower end of the first receiving surface toward the inner discharge portion.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
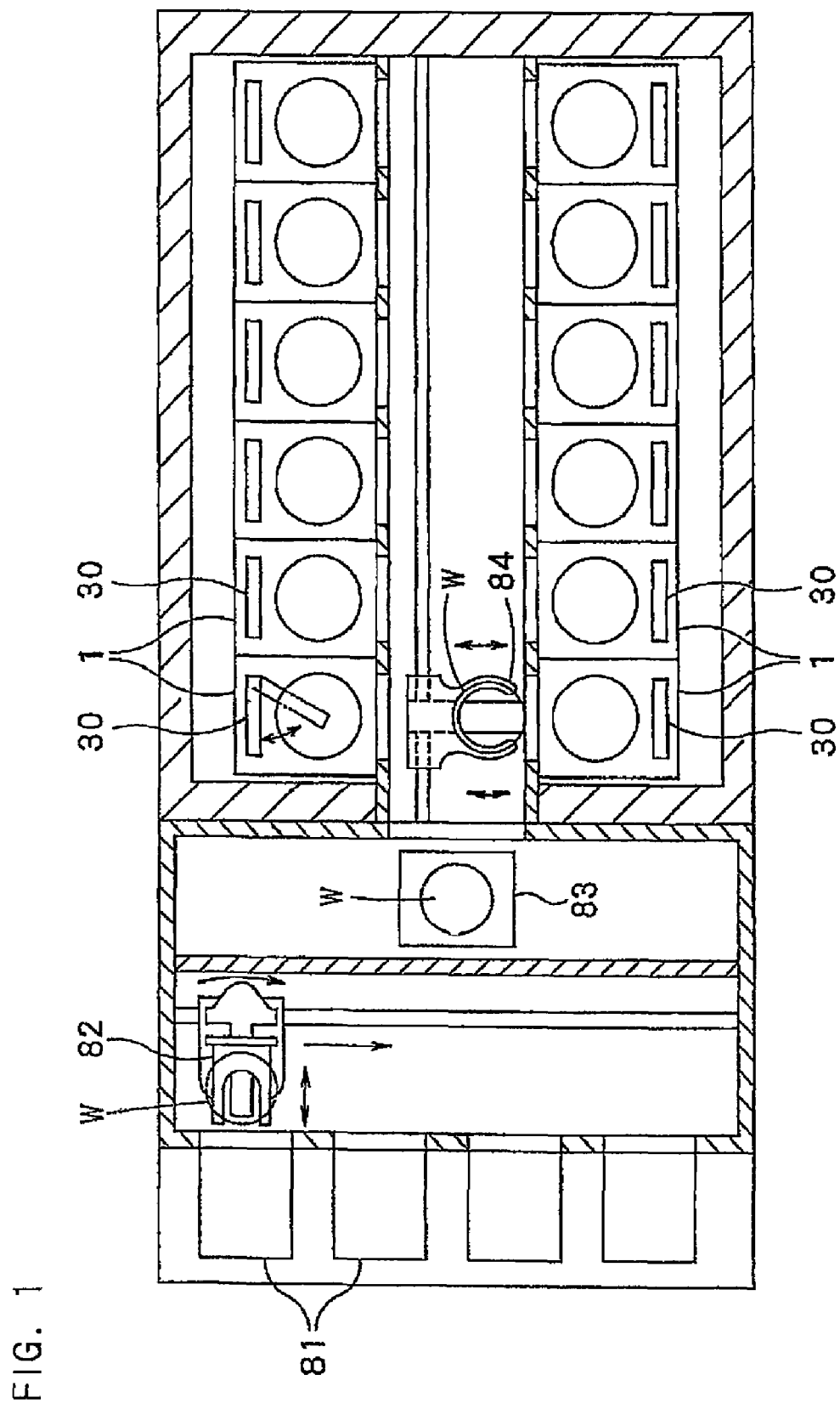
FIG. 1 is a top plan view of a liquid processing system including a liquid processing apparatus according to one embodiment of the present invention.

In the following detailed description, reference is made to the accompanying drawing, which form a part hereof The illustrative embodiments described in the detailed description, drawing, and claims are not meant to be limiting. Other embodiments may be utilized, and other changes may be made, without departing from the spirit or scope of the subject matter presented here.

The present invention provides a liquid processing apparatus and method capable of separately collecting first and second processing liquids from each other, and preventing a formation of a defect, such as watermarks and particles, on a substrate. Also, the present invention provides a computer readable storage medium on which is stored a computer program that causes a computer to execute the liquid processing method.

According to one embodiment, a liquid processing apparatus is provided. The liquid processing apparatus includes a substrate holding device to rotatably hold a substrate in a horizontal state, a processing liquid supply device to selectively supply a first processing liquid and a second processing liquid on the substrate held by the substrate holding device, a rotating cup disposed at an outside a circumferential periphery of the substrate held by the substrate holding device, the rotating cup including a first receiving surface to receive the first processing liquid and the second processing liquid that has been used in liquid processing of the substrate, an outer discharge portion and an inner discharge portion provided under the rotating cup so as to respectively discharge the first processing liquid and the second processing liquid received from the first receiving surface of the rotating cup, and a discharge portion switch device configured to move upwardly/downwardly at an outside a circumferential periphery of the rotating cup so as to open/close the outer discharge portion. A lower end of the first receiving surface of the rotating cup extends to a lower position than a position of the substrate held by the substrate holding device. In response to an opening of the outer discharge portion, the first processing liquid received from the first receiving surface of the rotating cup is discharged from the lower end of the first receiving surface toward the outer discharge portion. In response to a closing of the outer discharge portion, the second processing liquid received from the first receiving surface of the rotating cup is discharged from the lower end of the first receiving surface toward the inner discharge portion.

The first receiving surface of the rotating cup may incline in such a manner that an inside diameter of the first receiving surface increases from upside to downside of the first receiving surface.

The discharge portion switch device may include a second receiving surface to receive the first processing liquid received from the first receiving surface of the rotating cup. In response to the opening of the outer discharge portion, the first processing liquid received from the first receiving surface of the rotating cup may be discharged from the lower end of the first receiving surface toward the outer discharge portion via the second receiving surface of the discharge portion switch device.

The second receiving surface of the discharge portion switch device may incline in such a manner that an inside diameter of the second receiving surface increases from upside to downside of the second receiving surface.

The second receiving surface of the discharge portion switch device may be positioned below an outside the first receiving surface of the rotating cup in a state where the outer discharge portion is opened by lifting the discharge portion switch device.

The discharge portion switch device may open/close the outer discharge portion through interaction between the discharge portion switch device and an inner annular portion, the inner annular portion provided at the outer discharge portion, and the discharge portion switch device may include a first processing portion formed on a lower portion of an inside of the discharge portion switch device, the inner annular portion including a second stepped portion formed on an upper end of the inner annular portion. In response to the closing of the outer discharge portion, the first processing portion of the discharge portion switch device and the second stepped portion of the inner annular portion may engage with each other.

According to another embodiment, a method for performing liquid processing by using the liquid processing apparatus is provided. The method includes opening the outer discharge portion by lifting the discharge portion switch device, supplying the first processing liquid from the processing liquid supply device to the substrate held by the substrate holding device, rotating the substrate in a horizontal state and performing liquid processing of the substrate with the first processing liquid, and discharging the first processing liquid received from the first receiving surface of the rotating cup from the lower end of the first receiving surface toward the outer discharge portion after the liquid processing of the substrate has been performed.

The method may further include closing the outer discharge portion by lowering the discharge portion switch device, supplying the second processing liquid from the processing liquid supply device to the substrate held by the substrate holding device, rotating the substrate in a horizontal state and performing liquid processing of the substrate with the second processing liquid, and discharging the second processing liquid received from the first receiving surface of the rotating cup from the lower end of the first receiving surface toward the inner discharge portion after the liquid processing of the substrate has been performed.

According to further another embodiment, a computer readable storage medium is provided. A computer program is stored on the storage medium, and the computer program causes a computer to execute a method for performing liquid processing by using the liquid processing apparatus. The method includes opening the outer discharge portion by lifting the discharge portion switch device, supplying the first processing liquid from the processing liquid supply device to the substrate held by the substrate holding device, rotating the substrate in a horizontal state and performing liquid processing of the substrate with the first processing liquid, and discharging the first processing liquid received from the first receiving surface of the rotating cup from the lower end of the first receiving surface toward the outer discharge portion after the liquid processing of the substrate has been performed.

In the storage medium, the method may further include closing the outer discharge portion by lowering the discharge portion switch device, supplying a second processing liquid from the processing liquid supply device to the substrate held by the substrate holding device, rotating the substrate in a horizontal state, and performing liquid processing of the substrate with the second processing liquid, and discharging the second processing liquid received from the first receiving surface of the rotating cup from the lower end of the first receiving surface toward an inner discharge portion after the liquid processing of the substrate has been performed.

According to some embodiments of the present invention, since a lower end of a first receiving surface of a rotating cup extends to a lower position than a position of a substrate held by a substrate holding device, processing liquids can be efficiently discharged from the rotating cup without forming mist on the substrate. Thus, a substrate defect, such as a formation of watermarks or particles on the substrate can be prevented. Also, when an outer discharge portion is opened by lifting the discharge portion switch device, a first processing liquid received from the first receiving surface of the rotating cup is discharged from the lower end of the first receiving surface toward the outer discharge portion. In some embodiments, when the outer discharge portion is closed by lowering a discharge portion switch device, a second processing liquid received from the first receiving surface of the rotating cup is discharged from the lower end of the first receiving surface toward an inner discharge portion. Thus, a separate collection of the first processing liquid from the second processing liquid or vise versa can be achieved.

Figure 2:
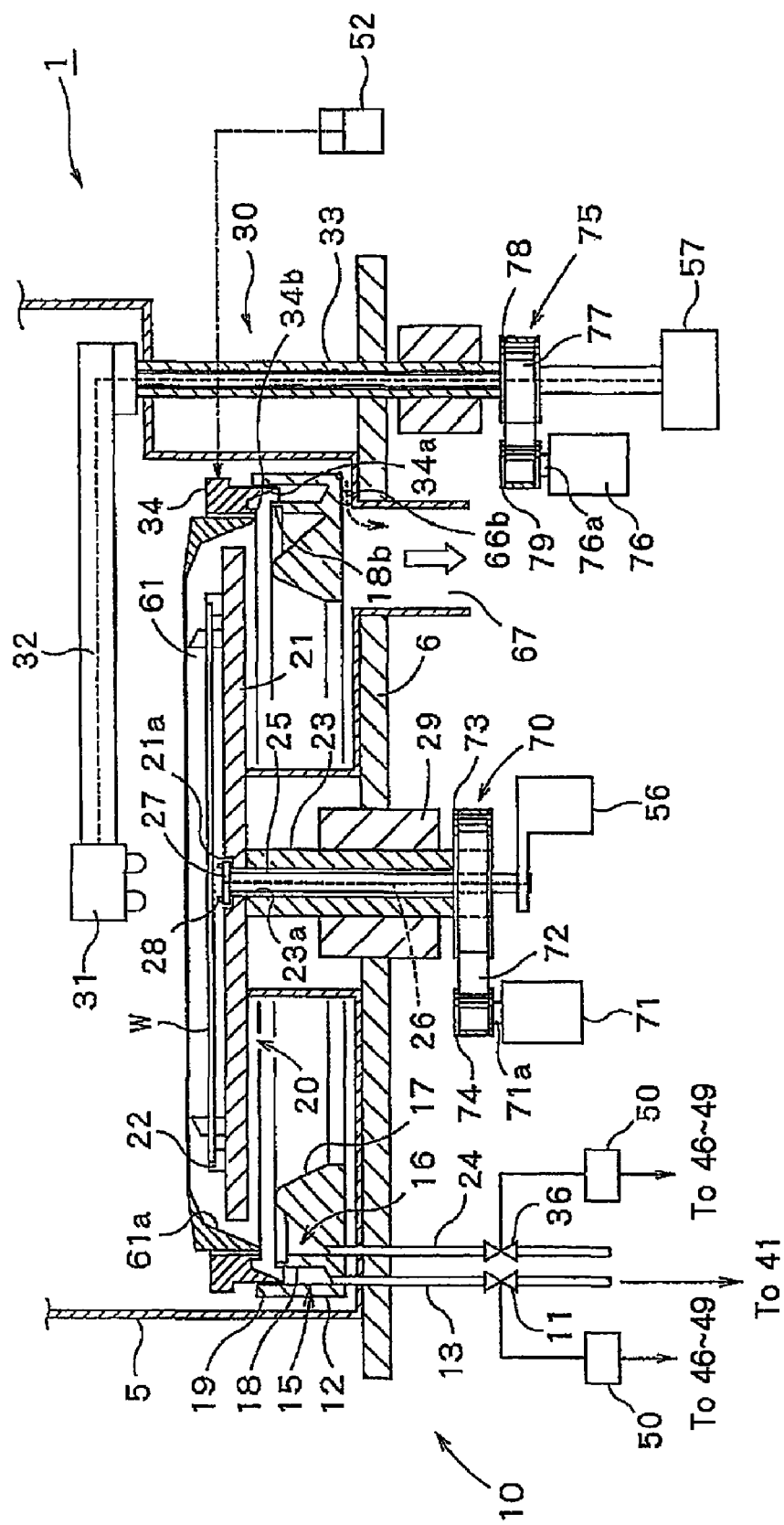
FIG. 2 is a cross-sectional view illustrating a liquid processing apparatus according to one embodiment of the present invention.
Figure 3:
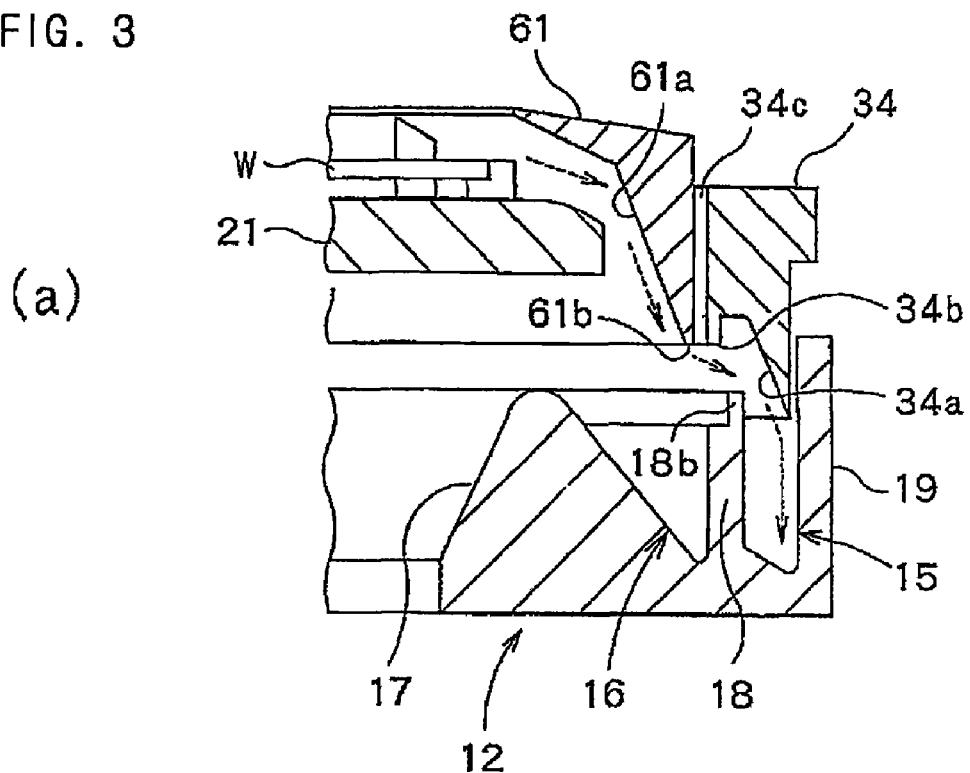
FIG. 3 is an enlarged cross-sectional view partially illustrating the liquid processing apparatus shown in FIG. 2 in states (a) where a ring valve rises, and (b) where the ring valve falls.
Figure 3:
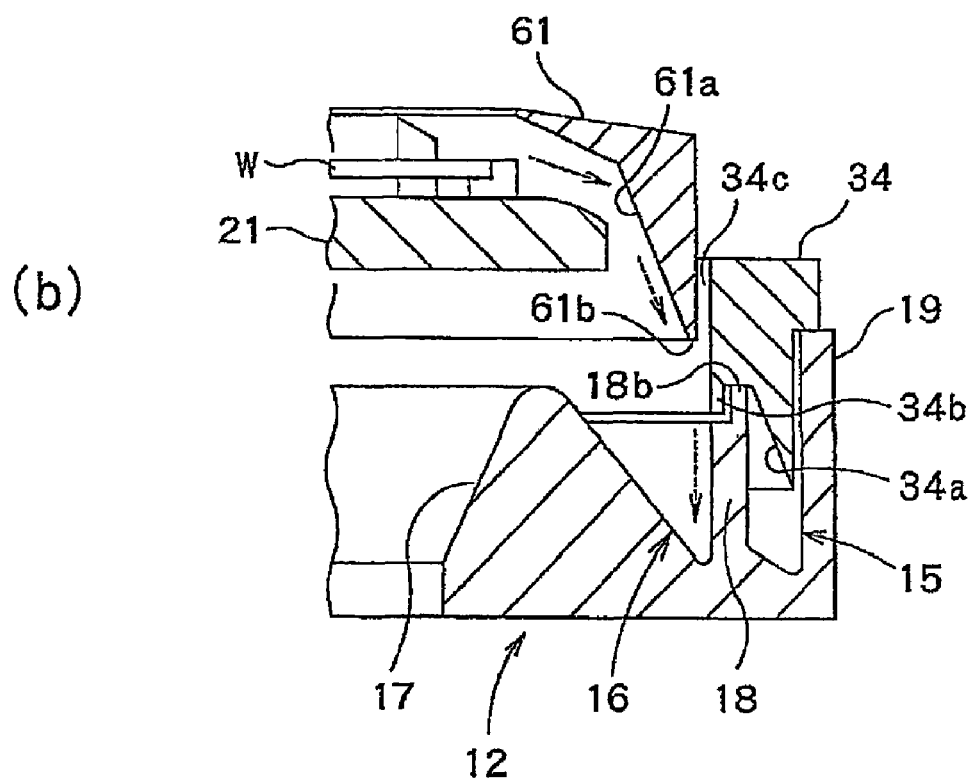
Figure 4:
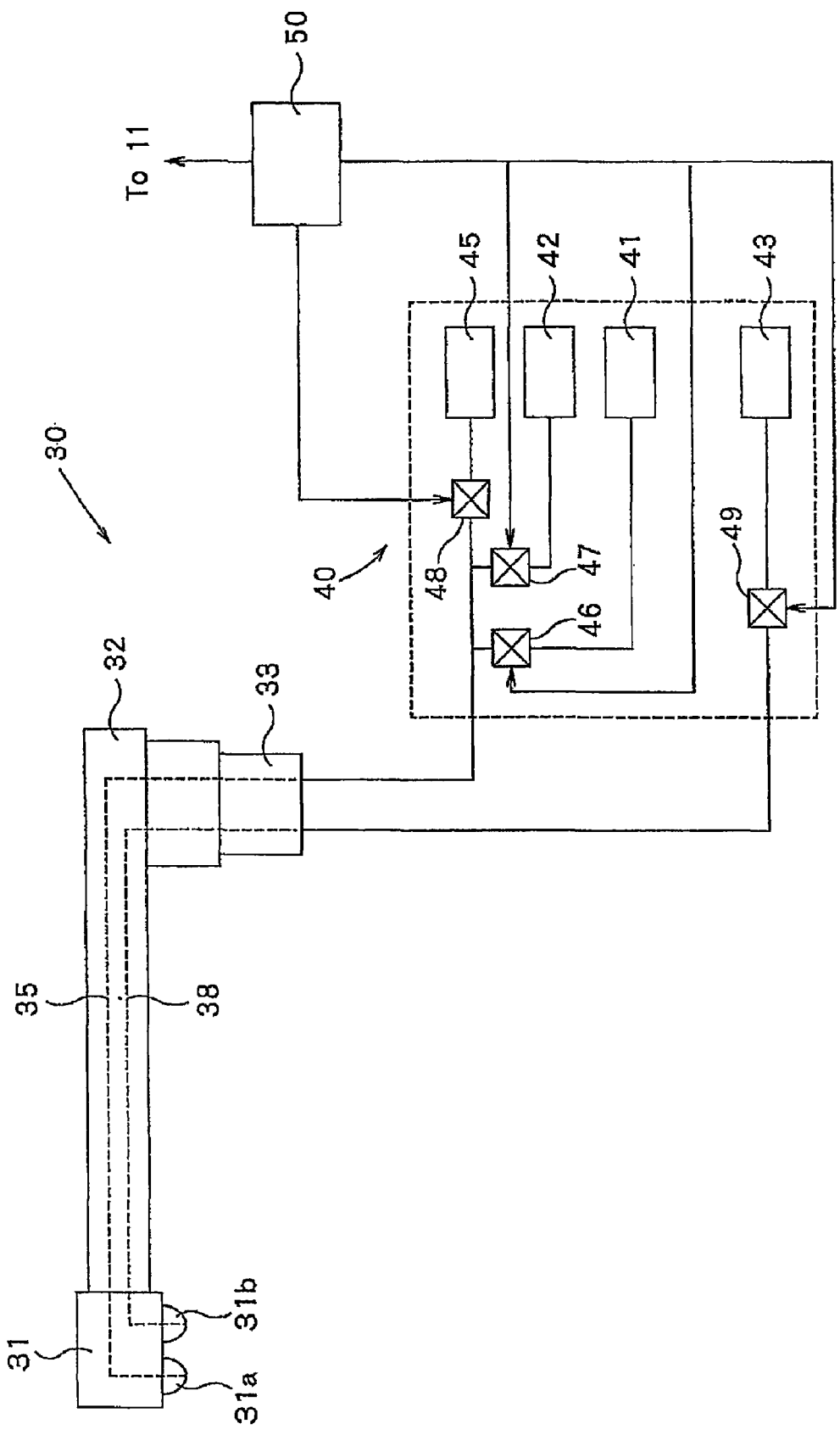
FIG. 4 is a schematic view illustrating the processing liquid supply device shown in FIG. 2.
Figure 5:
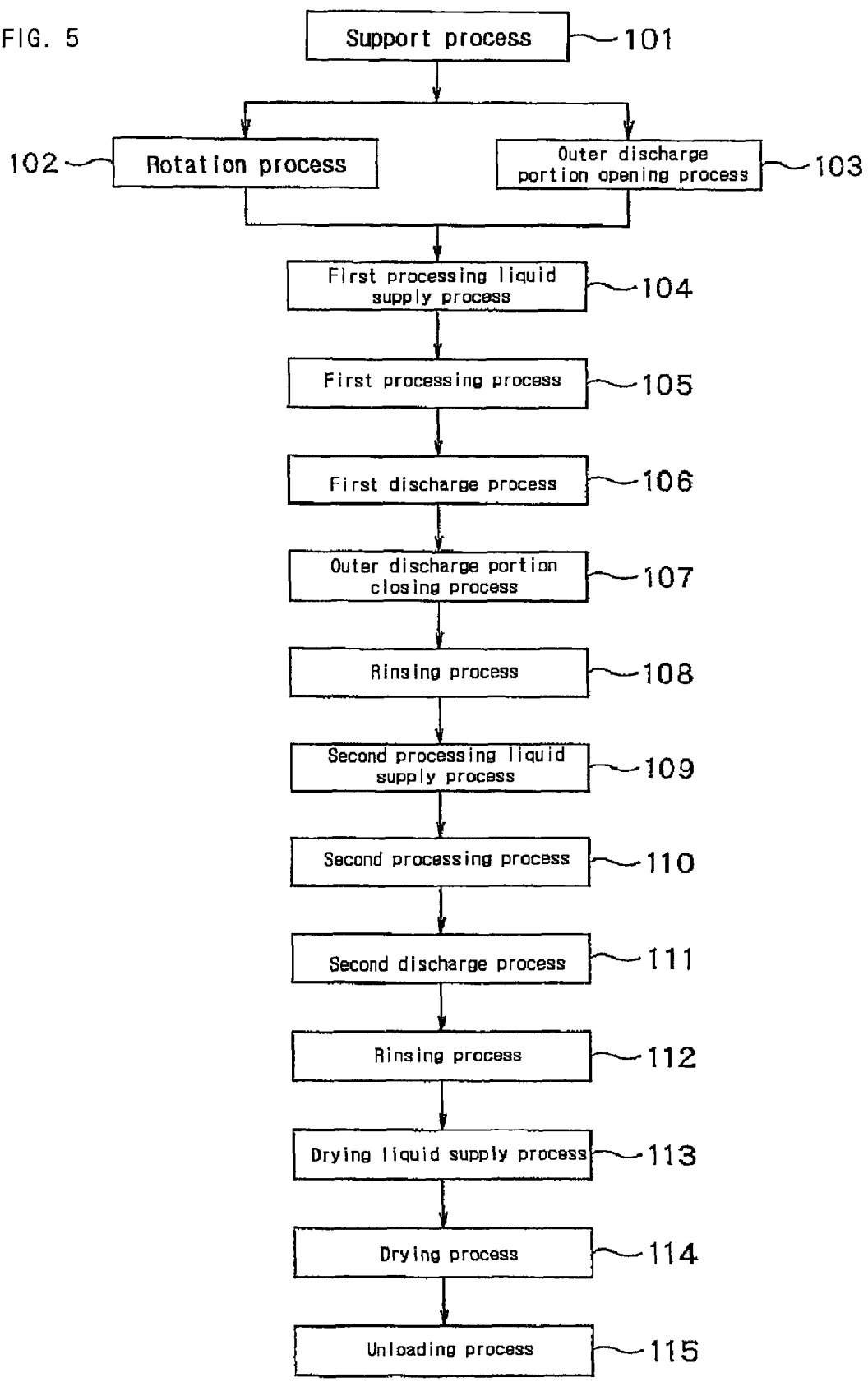
FIG. 5 is a flow chart illustrating a liquid processing method according to one embodiment of the present invention.

Hereinafter, a liquid processing apparatus, a liquid processing method, and a storage medium according to one embodiment of the present invention will be described with reference to FIGS. 1 to 5. FIG. 1 is a top plan view of a liquid-processing system including a liquid treatment apparatus according to one embodiment of the present invention. FIG. 2 is a cross-sectional view illustrating a liquid processing apparatus according to one embodiment of the present embodiment. FIG. 3 is an enlarged cross-sectional view partially illustrating the liquid processing apparatus shown in FIG. 2, in states (a) where a ring valve rises, and (b) where a ring valve falls. FIG. 4 is a schematic view illustrating the processing liquid supply device shown in FIG. 2. FIG. 5 is a flow chart illustrating a liquid processing method according to one embodiment of the present embodiment.

A liquid processing system including a liquid processing apparatus according to one embodiment will be described with reference to FIG. 1.

As shown in FIG. 1, the liquid processing system includes a loading plate 81 on which a carrier accommodating an outside semiconductor wafer W (hereinafter, "wafer W") as an object substrate is placed, a transfer arm 82 to take wafer W out of the carrier, a shelf unit 83 to place wafer W taken out by transfer arm 82 thereon, a main arm 84 to receive wafer W placed on shelf unit 83, and to carry wafer W into a liquid processing apparatus 1. Also, this liquid processing system includes multiple liquid processing apparatuses 1. For example, twelve liquid processing apparatuses are depicted in FIG. 1.

Hereinafter, a liquid processing apparatus according to one embodiment will now be described with reference to FIGS. 2 to 4.

As shown in FIG. 2, liquid processing apparatus 1 includes a casing 5, a substrate holding device 20 provided within casing 5 and configured to rotatably hold wafer W in a horizontal state, and a processing liquid supply device 30 to selectively supply a first processing liquid and a second processing liquid, which will be described later, on wafer W held by substrate holding device 20.

A rotating cup 61, which is connected to substrate holding device, is disposed at an outside of a circumferential periphery of wafer W held by substrate holding device 20. Rotating cup 61 covers wafer W from the outside of the circumferential periphery of wafer W. Rotating cup 61 can be integrately rotated with wafer W. Rotating cup 61 has a first receiving surface 61a on an inside rotating cut 61. First receiving surface 61a receives the first processing liquid and the second processing liquid after liquid processing of wafer W. First receiving surface 61a of rotating cup 61 inclines from an inside upper portion (which is on a wafer's side) to an outside lower portion (which is on a casing 5 sidewall's side) of first receiving surface 61a in such a manner that an inside diameter of first receiving surface 61a increases from upside to downside of first receiving surface 61a.

Meanwhile, a rotating device 70 is connected to substrate holding device 20. By rotating device 70, rotating cup 61 and substrate holding device 20 can be integrately rotated.

Also, as shown in FIG. 2, an annular drain cup 12 is disposed under the circumferential periphery of rotating cup 61 within casing 5 to receive the processing liquid which has been used to clean wafer W. Drain cup 12 is fixed not to rotate relative to casing 5.

Also, as shown in FIGS. 2 and 3, drain cup 12 has a first annular portion 17 which is on a center side of drain cup 12, a second annular portion (inner annular portion) 18 formed on an outside first annular portion 17, and a third annular portion (outer annular portion) 19 formed on an outside second annular portion 18.

Second annular portion 18 and third annular portion 19 form an outer discharge portion 15. Outer discharge portion 15 is formed under rotating cup 61 to discharge the first processing liquid received from first receiving surface 61a of rotating cup 61. Also, as shown in FIG. 2, a first drain pipe 13 is connected to outer discharge portion 15 to discharge the first processing liquid received in outer discharge portion 15.

First annular portion 17 and second annular portion 18 form an inner discharge portion 16. Inner discharge portion 16 discharges the second processing liquid. Inner discharge portion 16 is formed within outer discharge portion 15 and approximately below first receiving surface 61a of rotating cup 61. Also, as shown in FIG. 2, a second drain pipe 24 is connected to inner discharge portion 16 to discharge the second processing liquid received in inner discharge portion 16.

As shown in FIGS. 2 and 3, a ring-shaped valve (a discharge portion switch device) 34 to open/close outer discharge portion 15 is provided at the outside the circumferential periphery of the rotating cup 61. Ring-shaped valve 34 opens/closes outer discharge portion 15 through interaction between ring-shaped valve 34 and second annular portion 18 provided at outer discharge portion 15, and ring-shaped valve 34 is configured to being moved up/down by a cylinder device 52. a rotational direction of ring-shaped valve 34 can be controlled.

As shown in FIGS. 2 and 3, ring-shaped valve 34 has a second receiving surface 34a on an inside ring-shaped valve 34. Second receiving surface 34a receives the first processing liquid from first receiving surface 61a of rotating cup 61. Like first receiving surface 61a of rotating cup 61, second receiving surface 34a inclines in such a manner that an inside diameter of second receiving surface 34a increases from upside to downside of second receiving surface 34a. Also, an inclined angle of second receiving surface 34a with respect to a horizontal plane is substantially identical to that of first receiving surface 61a.

However, as shown in FIG. 2, a lower end 61b of first receiving surface 61a of rotating cup 61 extends to a lower position than a position of wafer W held by substrate holding device 20 so as to guide the first processing liquid and the second processing liquid which have been used to clean of wafer W toward a lower position than the position of wafer W. Thus, liquid splashing toward wafer W can be prevented.

Particularly, lower end 61b of first receiving surface 61a extends to a lower position than a position of a rotating plate 21 (which will be described later), and is positioned at a substantially identical height as a lower end of a first stepped portion 34b (which will be described later) of ring-shaped valve 34 in a lifting state (see FIG. 3a).

Also, as shown in a diagram (a) of FIG. 3, second receiving surface 34a of ring-shaped valve 34 is positioned below the outside first receiving surface 61a of rotating cup 61 when outer discharge portion 15 is opened by the lifting of ring-shaped valve 34. In this case, the first processing liquid received from first receiving surface 61a of rotating cup 61 is discharged from lower end 61b of first receiving surface 61a toward outer discharge portion 15 via second receiving surface 34a of ring-shaped valve 34.

On the other hand, as shown in a diagram (b) of FIG. 3, outer discharge portion 15 is closed by the lowering of ring-shaped valve 34. In this case, the second processing liquid received from first receiving surface 61a of rotating cup 61 is discharged from lower end 61b of first receiving surface 61a toward inner discharge portion 16.

Ring-shaped valve 34 has first stepped portion 34b formed on a lower portion of an inside of ring-shaped valve 34, and second annular portion 18 has a second stepped portion 18b formed on an upper end of second annular portion 18. As shown in the diagram (b) of FIG. 3, when outer discharge portion 15 is closed by the lowering of ring-shaped valve 34, first stepped portion 34b of ring-shaped valve 34 is engaged with second stepped portion 18b of second annular portion 18. Thus, outer discharge portion 15 can be tightly closed.

As shown in FIG. 2, substrate holding device 20 includes rotating plate 21 horizontally provided and formed into a disc-shape, a holding member 22 provided at an end portion of a circumferential periphery of rotating plate 21 so as to hold wafer W, and a cylindrical rotating shaft 23 connected to a center of a rear surface of rotating plate 21, cylindrical rotating shaft 23 extending in a vertical downward direction. Circular hole 21a is formed at a center of rotating plate 21. Hole 21a is communicated with a hole 23a of cylindrical rotating shaft 23. An elevating member 25 is installed within hole 23a of cylindrical rotating shaft 23, and elevating member 25 can move upward and downward by an elevating device 56.

Also, as shown in FIG. 2, elevating member 25 includes a rear surface processing liquid supply path 26 to supply processing liquid below a rear surface (lower surface) side of wafer W. Elevating member 25 further includes a wafer holder 27 at an upper end portion of elevating member 25. Water holder 27 includes a wafer holding pin 28 provided at a top side of water holder 27 to hold wafer W. Rotating shaft 23 is rotatably supported on a base plate 6 through a bearing member 29.

As shown in FIG. 2, rotating device 70 includes a motor 71 having a motor shaft 71a, and a belt 72 wound around motor shaft 71a and the lower end portion of rotating shaft 23. A pulley 74 is provided between belt 72 and motor shaft 71a, and a pulley 73 is provided between belt 72 and rotating shaft 23.

Referring again to FIG. 2, gas from a fan filter unit (FFU, not shown) of the liquid processing system is supplied to wafer W held by substrate holding device 20 from an upper direction of wafer W. The FFU has a chemical filter to adsorb an alkaline component, and thus can prevent an alkaline atmosphere from transferring from an outside into casing 5.

A slit-shaped ventilation hole 66b is formed at the lower end of drain cup 12, and guides the gas to an exhaust pipe 67 through the upper portion of the circumferential periphery of rotating cup 61 (see the dotted arrow in FIG. 2).

Processing liquid supply device 30 as depicted in FIG. 2 includes a nozzle block 31 to supply the first processing liquid and the second processing liquid onto a surface of wafer W held by substrate holding device 20, a nozzle arm 32 connected to nozzle block 31 to move nozzle block 31 along the surface of wafer W held by substrate holding device 20, a nozzle rocking shaft 33 extending from nozzle arm 32 in a vertically downward direction, and a nozzle driving part 75 to drive nozzle rocking shaft 33. Also, a nozzle elevating device 57 is connected to the lower end of nozzle rocking shaft 33 to drive nozzle block 31, nozzle arm 32, nozzle rocking shaft 33, and nozzle driving part 75 in an upward and downward direction.

Nozzle driving part 75 includes a motor 76 having a motor shaft 76a and a belt 77 wound around motor shaft 76a and the lower end portion of nozzle rocking shaft 33. A pulley 79 is provided between belt 77 and motor shaft 76a, and a pulley 78 is provided between belt 77 and nozzle rocking shaft 33.

As shown in FIG. 4, a processing liquid flow path 35 and a drying solvent flow path 38 are provided within nozzle block 31 having nozzles 31a and 31b, nozzle arm 32 and nozzle rocking shaft 33 of processing liquid supply device 30. The first processing liquid and the second processing liquid pass through processing liquid flow path 35, and a drying solvent passes through drying solvent flow path 38. Also, processing liquid flow path 35 and drying solvent flow path 38 are communicated with a processing liquid supply part 40.

Processing liquid supply part 40 includes a first source 41 and a second source 42 to supply the first and second processing liquids, respectively, as chemical liquids for a cleaning processing, a DIW source 45 to supply deionized water (DIW) as a rinsing liquid, and an IPA source 43 to supply isopropyl alcohol (IPA) as a drying solvent. Also, examples of the combination of the first processing liquid and the second processing liquid may include, without limitations, a combination of ammonia-hydrogen peroxide solution (SC1: a first processing liquid) and diluted hydrofluoric acid (DHF: a second processing liquid), or a combination of sulfuric acid hydrogen peroxide mixture (SPM: a first processing liquid) and ammonia-hydrogen peroxide-solution (SC1: a second processing liquid), which will be described later.

Processing liquid flow path 35 is communicated with first source 41 via a first valve 46, with second source 42 via a second valve 47, and with DIW source 45 via a third valve 48. Drying solvent flow path 38 is communicated with IPA source 43 via a fourth valve 49.

Referring again to FIG. 4, when processing liquid flow path 35 is communicated with first source 41 by opening only first valve 46, processing liquid supply device 30 supplies the first processing liquid, as a chemical liquid for the cleaning processing, from first source 41. Thus, a first chemical liquid supply device can include nozzle block 31 having nozzles 31a and 31b, nozzle arm 32, nozzle rocking shaft 33, processing liquid flow path 35, nozzle driving part 75 (see FIG. 2), first valve 46, and first source 41.

Alternatively, when processing liquid flow path 35 is communicated with second source 42 by opening only second valve 47, processing liquid supply device 30 supplies the second processing liquid, as a chemical liquid for the cleaning processing, from second source 42. Thus, a second chemical liquid supply device can include nozzle block 31 having nozzles 31a and 31b, nozzle arm 32, nozzle rocking shaft 33, processing liquid flow path 35, nozzle driving part 75 (see FIG. 2), second valve 47, and second source 42.

Referring again to FIG. 4, a drying liquid supply device can include nozzle block 31 having nozzles 31a and 31b, nozzle arm 32, nozzle rocking shaft 33, drying solvent flow path 38, nozzle driving part 75 (see FIG. 2), fourth valve 49, and IPA source 43. The drying liquid supply device supplies IPA (an organic solvent) to dry wafer W Referring again to FIG. 4, when processing liquid flow path 35 is communicated with DIW source 45 by opening only third valve 48, processing liquid supply device 30 supplies deionized water (cleaning liquid), as a rinsing liquid for rinsing the chemical liquid. Therefore, a cleaning liquid supply device can include the nozzle block 31 having the nozzles 31a and 31b, the nozzle arm 32, the nozzle rocking shaft 33, the processing liquid flow path 35, the nozzle driving part 75 (see FIG. 2), the third valve 48, and the DIW source 45. The cleaning liquid supply device supplies the deionized water (the rinsing liquid of the chemical liquid) to wafer W held by substrate holding device 20.

A device to supply the processing liquids to rear surface processing liquid supply path 26, as depicted in FIG. 2, has the same configuration as the above described processing liquid supply part 40, except that IPA source 43 is not provided in the device.

As shown in FIG. 2, first drain pipe 13 includes a blocking valve (a blocking device) 11 to block the flow of the first processing liquid passing through first drain pipe 13. First drain pipe 13 is blocked by closing blocking valve 11. First drain pipe 13 is connected to first source 41, and thus can transfer the first processing liquid from first drain pipe 13 back to first source 41 to re-use the first processing liquid.

Second drain pipe 24 includes a blocking valve (a blocking device) 36 to block the flow of the second processing liquid passing through second drain pipe 24. Second drain pipe 24 is blocked by closing blocking valve 36. Unlike the first processing liquid, the second processing liquid discharged from second drain pipe 24 to an outside is not re-used.

As shown in FIGS. 2 and 4, a control part 50 is connected to each of first valve 46, second valve 47, third valve 48, fourth valve 49, and blocking valve 11. Thus, each of the above mentioned supply devices, such as the first chemical liquid supply device, the second chemical liquid supply device, the drying liquid supply device, and the cleaning liquid supply device, can be controlled by control part 50.

Hereinafter, an operation of the liquid processing system according to one embodiment will be described.

More specifically, a liquid processing method for cleaning wafer W by liquid processing apparatus 1 according to one embodiment will be described. In one embodiment, it is assumed that ammonia-hydrogen peroxide solution is used as the first processing liquid, and diluted hydrofluoric acid is used as the second processing liquid.

Wafer W held by main arm 84 is carried into casing 5 of liquid processing apparatus 1. The carried wafer W is transferred onto wafer holding pin 28 provided on wafer holder 27 in a state where elevating member 25 rises. Then, elevating member 25 falls, and wafer W is chucked and supported by holding member (a support process 101) (see FIGS. 2 and 5).

Then, wafer W held by the substrate holding device 20 is integrally rotated with rotating cup 61 by rotating device 70 (a rotation process 102) (see FIGS. 2 and 5). Also, wafer W and rotating cup 61 continuously integrally rotate until a following drying process 114 is completed.

More specifically, when motor shaft 71a of motor 71 rotates, belt 72 wound around motor shaft 71a and the lower end portion of rotating shaft 23 is rotated, thereby rotating rotating shaft 23. Since rotating cup 61 is integrally formed with substrate holding device 20, the rotation of rotating shaft 23 allows rotating cup 61 to rotate integrally with substrate holding device 20.

Prior to or after the above described rotation process 102, ring-shaped valve 34 rises by cylinder device 52, thereby opening outer discharge portion 15 (an opening process 103 of outer discharge portion) (see FIGS. 2, 3, and 5).

Then, processing liquid supply device 30 performs predetermined liquid processing on wafer W held by substrate holding device 20 (see FIGS. 2 to 5). The detailed processes will be illustrated hereinafter. Meanwhile, all of valves 46, 47, 48, and 49 are in a closed state before a first processing liquid supply process 104 which will be illustrated hereinafter is carried out (see FIG. 4).

In response to a signal from control part 50, first valve 46 is opened, and the first processing liquid (SC1) is supplied from first source 41. The first processing liquid is supplied to wafer W held by substrate holding device 20 via nozzle 31a (first processing liquid supply process 104) (see FIGS. 2, 3 (diagram (a)), 4, and 5).

Thus, while wafer W and rotating cup 61 are rotated in a horizontal state, wafer W is subjected to liquid processing with the first processing liquid (ammonia-hydrogen peroxide solution) (a first processing process 105).

The first processing liquid supplied to wafer W is scattered toward first receiving surface 61a of rotating cup 61 by a centrifugal force caused by the rotation of wafer W (see the dotted arrow in the diagram (a) of FIG. 3). The first processing liquid scattered as described above is received by first receiving surface 61a of rotating cup 61, and flows downward along first receiving surface 61a.

Then, the first processing liquid flowing down along first receiving surface 61a is scattered downward with a slant from lower end 61b of first receiving surface 61a by the centrifugal force caused by rotation of the rotating cup 61. The first processing liquid passes through between first stepped portion 34b of ring-shaped valve 34 and second stepped portion 18b of second annular portion 18, and then reaches second receiving surface 34a of ring-shaped valve 34.

The first processing liquid is discharged from second receiving surface 34a of ring-shaped valve 34 toward outer discharge portion 15 (a first discharge process 106) (see the dotted arrow in the diagram (a) of FIG. 3). Thereafter, the first processing liquid is sent back to first source 41 from outer discharge portion 15 via first drain pipe 13 (see FIGS. 2 and 4).

Then, ring-shaped valve 34 falls by cylinder device 52, thereby closing outer discharge portion 15 (a closing process 107 of an outer discharge portion) (see FIGS. 2, 3 (diagram (b)) and 5). Since first stepped portion 34b of ring-shaped valve 34 engages with second stepped portion 18b of second annular portion 18, outer discharge portion 15 is tightly closed by ring-shaped valve 34.

In response to the signal from control part 50, first valve 46 is closed, third valve 48 is opened, and deionized water is supplied from DIW source 45. The deionized water is supplied to wafer W via nozzle 31a, thereby cleaning a surface of wafer W (a rinsing process 108) (see FIGS. 4 and 5). The deionized water that has been used to process wafer W is received by first receiving surface 61a of rotating cup 61 as the second processing liquid is received, which is described below, and then is discharged from lower end 61b of first receiving surface 61a toward inner discharge portion 16.

In response to the signal from the control part 50, third valve 48 is closed and second valve 47 is opened, and thus the second processing liquid (diluted hydrofluoric acid) is supplied from second source 42. The second processing liquid (diluted hydrofluoric acid) is supplied to wafer W held by substrate holding device 20 via nozzle 31a (a second processing liquid supply process 109) (see FIGS. 2, 3 (diagram (b)), 4 and 5).

Accordingly, while wafer W and rotating cup 61 are rotated in a horizontal state, wafer W is subjected to liquid processing with the second processing liquid (diluted hydrofluoric acid) (a second processing process 110).

After liquid processing of wafer W is performed during second processing process 110, the second processing liquid is scattered toward first receiving surface 61a of rotating cup 61 by the centrifugal force caused by the rotation of wafer W (see the dotted arrow in the diagram (b) of FIG. 3). The second processing liquid scattered as described above is received by first receiving surface 61a of rotating cup 61, and flows downward along first receiving surface 61a.

Then, the second processing liquid flowing down along first receiving surface 61a is scattered downward with a slope from lower end 61b of first receiving surface 61a by the centrifugal force caused by the rotation of rotating cup 61. The second processing liquid reaches an inner wall surface 34c of ring-shaped valve 34, and then is discharged from inner wall surface 34c of ring-shaped valve 34 toward inner discharge portion 16 (a second discharge process 111).

Since first stepped portion 34b of ring-shaped valve 34 engages with second stepped portion 18b of second annular portion 18, the second processing liquid cannot pass through between ring-shaped valve 34 and second annular portion 18 and thus cannot flow into outer discharge portion 15. Therefore, since first stepped portion 34b of ring-shaped valve 34 is disposed at more inner side (inner discharge portion 16's side] than second stepped portion 18b of second annular portion 18, the prevention of the second processing liquid from passing over second stepped portion 18b and flowing into outer discharge portion 15 can be guaranteed.

Thereafter, the second processing liquid is discharged from inner discharge portion 16 to an outside via second drain pipe 24.

In response to the signal from control part 50, second valve 47 is closed, third valve 48 is opened, and deionized water is supplied from DIW source 45. The deionized water is supplied to wafer W held by substrate holding device 20 via nozzle 31a (a rinsing process 112) (see FIGS. 4 and 5).

In response to the signal from control part 50, third valve 48 is closed, fourth valve 49 is opened, and IPA for drying wafer W is supplied to wafer W via nozzle 31b (a drying liquid supply process 113) (see FIGS. 4 and 5).

Nozzle rocking shaft 33 is driven by nozzle driving part 75. Nozzles 31a and 31b of nozzle block 31 provided in nozzle arm 32 rock along the surface of wafer W by nozzle rocking shaft 33 (see FIG. 2).

After IPA is supplied to wafer W, wafer W held by substrate holding device 20 is rotated at a higher rate than the rate at drying liquid supply process 113. Thus, the IPA adhered to wafer W is shaken off, and wafer W is dried (a drying process 114).

As described above, rotating cup 61 integrally rotates with substrate holding device 20 during each process. Accordingly, the processing liquid is subjected to a centrifugal force when each processing liquid shaken off from wafer W reaches rotating cup 61. Thus, the processing liquid is hardly scattered as mist.

After the processed wafer W is released from chucking by holding member 22, wafer W is separated from substrate holding device 20, and wafer W is unloaded to an outside casing 5 (an unloading process 115) (see FIG. 2).

However, if there exists an ammonia (alkaline) component even in small amounts in an ambient atmosphere of wafer W in the above described second processing process 110, a spot (such as a watermark) may generally occur on wafer W after drying process 114.

On the other hand, in some embodiments of the present invention, first stepped portion 34b of ring-shaped valve 34 engages with second stepped portion 18b of second annular portion 18, thereby tightly closing outer discharge portion 15. Accordingly, during second processing process 110, the ammonia component of the first processing liquid (ammonia-hydrogen peroxide solution) will not be leaked from outer discharge portion 15, and it will not reach the ambient atmosphere of wafer W. Thus, the formation of a spot (such as a watermark) on the wafer W can be prevented.

Although it has been illustrated that the first processing liquid supplied from first source 41 and the second processing liquid supplied from second source 42 are supplied to wafer W by using one nozzle arm 32 and one nozzle block 31 having nozzles 31a and 31b, the present invention is not limited thereto. Each of the first processing liquid supplied from first source 41 and the second processing liquid supplied from second source 42 may be supplied to wafer W by using a dedicated nozzle arm and a dedicated nozzle block (including nozzles).

Although it has been illustrated that ammonia-hydrogen peroxide solution has been used as the first processing liquid, and diluted hydrofluoric acid has been used as the second processing liquid, the present invention is not limited thereto. For example, sulfuric acid hydrogen peroxide mixture and ammonia-hydrogen peroxide solution may be used as the processing liquids. In this case, in order to collect sulfuric acid hydrogen peroxide mixture, the sulfuric acid hydrogen peroxide mixture may be used as the first processing liquid, and ammonia-hydrogen peroxide solution may be used as the second processing liquid. Among the two processing liquids, a processing liquid that is desired to be collected (or reused) from outer discharge portion 15, or a processing liquid that is desired not to be leaked into the ambient atmosphere of wafer W, may be set as the first processing liquid.

Also, in some embodiments, a computer program or a storage medium storing such a computer program is provided. The computer program can be executed on a computer to perform the illustrated liquid processing method using liquid processing apparatus 1.

As described above, according to one embodiment, lower end 61b of first receiving surface 61a of rotating cup 61 extends to a lower position than the position of wafer W held by substrate holding device 20. Accordingly, the splashing of the first processing liquid and the second processing liquid toward rotating cup 61 can be prevented, and thus the occurrence of a defect (such as watermarks or particles) on wafer W can be prevented.

Further, according to one embodiment, when outer discharge portion 15 is opened by lifting ring-shaped valve 34, the first processing liquid received from first receiving surface 61a of rotating cup 61 flows along first receiving surface 61a and then is discharged from lower end 61b of first receiving surface 61a toward outer discharge portion 15. When outer discharge portion 15 is closed by lowering ring-shaped valve 34, the second processing liquid received from first receiving surface 61a of rotating cup 61 flows along first receiving surface 61a and is then discharged from lower end 61b of first receiving surface 61a toward inner discharge portion 16. Through these processes, it is possible to separately collect the first processing liquid and the second processing liquid from each other.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
 a substrate holding device to rotatably hold a substrate in a horizontal state;
 a processing liquid supply device to selectively supply a first processing liquid and a second processing liquid on the substrate held by the substrate holding device;
 a rotating cup disposed at an outside a circumferential periphery of the substrate held by the substrate holding device, the rotating cup comprising a first receiving surface to receive the first processing liquid and the second processing liquid that have been used in liquid processing of the substrate;
 an outer discharge portion and an inner discharge portion provided under the rotating cup so as to respectively discharge the first processing liquid and the second processing liquid received from the first receiving surface of the rotating cup; and
 a discharge portion switch device configured to move upwardly/downwardly at an outside a circumferential periphery of the rotating cup so as to open/close the outer discharge portion,
 wherein a lower end of the first receiving surface of the rotating cup extends to a lower position than a position of the substrate held by the substrate holding device, in response to an opening of the outer discharge portion, the first processing liquid received from the first receiving surface of the rotating cup is discharged from the lower end of the first receiving surface toward the outer discharge portion and in response to a closing of the outer discharge portion, the second processing liquid received from the first receiving surface of the rotating cup is discharged from the lower end of the first receiving surface toward the inner discharge portion, wherein the discharge portion switch device comprises a second receiving surface to receive the first processing liquid received from the first receiving surface of the rotating cup, in response to the opening of the outer discharge portion, the first processing liquid received from the first receiving surface of the rotating cup is discharged from the lower end of the first receiving surface toward the outer discharge portion via the second receiving surface of the discharge portion switch device, and wherein the discharge portion switch device opens/closes the outer discharge portion through interaction between the discharge portion switch device and an inner annular portion, the inner annular portion provided at the outer discharge portion, and the discharge portion switch device comprises a first stepped portion formed on a lower portion of an inside of the discharge portion switch device, the inner annular portion comprising a second stepped portion formed on an upper end of the inner annular portion, in response to the closing of the outer discharge portion, the first stepped portion of the discharge portion switch device and the second stepped portion of the inner annular portion engage with each other.

2. The liquid processing apparatus of claim 1, wherein the first receiving surface of the rotating cup inclines in such a manner that an inside diameter of the first receiving surface increases from upside to downside of the first receiving surface.

3. The liquid processing apparatus of claim 1, wherein the second receiving surface of the discharge portion switch device inclines in such a manner that an inside diameter of the second receiving surface increases from upside to downside of the second receiving surface.

4. The liquid processing apparatus of claim 1, wherein the second receiving surface of the discharge portion switch device is positioned below an outside the first receiving surface of the rotating cup in a state where the outer discharge portion is opened by lifting the discharge portion switch device.

* * * * *